(12) United States Patent
Fisher

(10) Patent No.: US 6,721,923 B2
(45) Date of Patent: Apr. 13, 2004

(54) SYSTEM AND METHOD FOR GENERATING INTEGRATED CIRCUIT BOUNDARY REGISTER DESCRIPTION DATA

(75) Inventor: Rory L. Fisher, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 137 days.

(21) Appl. No.: 10/079,337

(22) Filed: Feb. 20, 2002

(65) Prior Publication Data

US 2003/0159124 A1 Aug. 21, 2003

(51) Int. Cl.$^7$ .............................................. G06F 17/50
(52) U.S. Cl. ....................... 716/1; 716/3; 716/4; 716/5; 716/18
(58) Field of Search ............................. 716/1, 2–6, 18; 714/30, 727; 703/14, 15; 702/122

(56) References Cited

U.S. PATENT DOCUMENTS

| | | | | |
|---|---|---|---|---|
| 5,517,637 | A | * | 5/1996 | Bruce et al. ................... 703/15 |
| 5,682,392 | A | * | 10/1997 | Raymond et al. ........... 714/727 |
| 6,058,255 | A | * | 5/2000 | Jordan ........................... 716/4 |
| 6,449,755 | B1 | * | 9/2002 | Beausang et al. .............. 716/5 |
| 6,536,008 | B1 | * | 3/2003 | Nadeau-Dostie et al. ... 714/726 |
| 6,539,520 | B1 | * | 3/2003 | Tiong et al. .................... 716/3 |
| 2002/0049558 | A1 | * | 4/2002 | Reis et al. ................... 702/122 |
| 2002/0120895 | A1 | * | 8/2002 | Suzuki ....................... 714/727 |
| 2002/0184562 | A1 | * | 12/2002 | Nadeau-Dostie et al. ..... 714/30 |
| 2003/0145286 | A1 | * | 7/2003 | Pajak et al. ..................... 716/1 |
| 2003/0145297 | A1 | * | 7/2003 | Cote et al. ...................... 716/6 |

* cited by examiner

Primary Examiner—Vuthe Siek
Assistant Examiner—Magid Dimyan

(57) ABSTRACT

A system and method for generating a boundary-scan description language file is disclosed. In a simplified embodiment of the invention, the system utilizes a memory; software stored within the memory defining functions to be performed by the system; and a processor. The processor is configured by the software to: create a flat netlist that describes the integrated circuit, wherein the flat netlist comprises connectivity information regarding leaf cells within the integrated circuit; determine and store a name provided for each joint test action group register located within the integrated circuit, from the created flat netlist; determine relationships between each joint test action group register located within the integrated circuit and at least one input/output pin located within the integrated circuit, from the created flat netlist, and store a description of the relationships; and create a boundary-scan description language file from the stored names of each joint test action group and the stored description of the relationship between the joint test action group register and the input/output pin.

20 Claims, 4 Drawing Sheets

SYSTEM AND METHOD FOR GENERATING INTEGRATED CIRCUIT BOUNDARY REGISTER DESCRIPTION DATA

FIELD OF THE INVENTION

The present invention generally relates to integrated circuit testing and, more particularly, is related to automating creation of a Boundary-Scan Description Language (BSDL) file.

BACKGROUND OF THE INVENTION

With advancements in technology, new integrated circuits (ICs) have been developed to perform different logical functions. ICs are packaged into fine pitch, high-count packages so that a single IC may perform an increasing number of logical functions. ICs are tested prior to use to ensure that electrical characteristics and conductivity are within ranges required to perform specified functions. Unfortunately, high density ICs pose unique manufacturing challenges such as, but not limited to, accessibility of test points and high cost of test equipment.

In 1985, a group of European companies formed the Joint European Test Action Group (JETAG) to address IC testing challenges. JETAG called for incorporating hardware into standard components controlled via software, thereby eliminating the need for sophisticated in-circuit test equipment. By 1988, the standard component concept gained momentum in North America and several companies formed the Joint Test Access Group (JTAG) consortium to formalize the standard component concept. Thereafter, in 1990, the Institute of Electrical and Electronic Engineers (IEEE) refined the standard component concept and created the IEEE/ANSI 1149.1 standard, also known as the IEEE Standard Test Access Port and Boundary-scan Architecture.

The IEEE/ANSI 1149.1 standard was developed to provide standard test facilities and test points in ICs to ensure IC compatibility. Compatibility of ICs that are compliant with the 1149.1 standard allows universal testing techniques to be utilized for the compliant ICs. As more people became aware of, and used, the IEEE/ANSI 1149.1 standard, the need for a standard method for describing IEEE/ANSI 1149.1 standard compatible devices, including ICs, was recognized. The IEEE/ANSI 1149.1 standard working group established a subcommittee to develop a device description language to address the need for a standard method for describing IEEE/ANSI 1149.1 compatible devices.

The subcommittee has since developed and approved an industry standard language called Boundary-scan Description Language (BSDL). BSDL is a subset of the VHSIC Hardware Description Language (VHDL), which describes how the IEEE/ANSI 1149.1 standard is implemented in a device and how that device operates. The IEEE/ANSI 1149.1 standard, which is incorporated by reference here in its entirety, describes an in-circuit testing scheme using "scan registers" to capture data from input and output pins of the IC. The term "register" broadly refers to groups of digital logic storage units that are read or written as a unit. For example, a simple register may be constructed from a group of "flip-flops" whose outputs toggle simultaneously in response to a "clock" timing signal. In another type of register, called a "shift register," stored values can also be circulated between the storage elements in the register when a particular control signal is pulsed.

Scan registers act as a group of flip-flops until they are switched into a test mode where they become one long shift register. This configuration allows data to be "clocked" serially through all of the scan registers and out of an output pin at the same time that new data is being clocked in from an input pin. A detailed discussion of boundary-scan testing and scan registers is provided in "The Boundary-Scan Handbook" by Kenneth P. Parker (Kluwer Academic Publishers, 2d edition) and "Agilent 3070 Family Boundary-Scan Fundamentals H7230A Opt 210 (E3795C)" (Agilent Technologies), both of which are also incorporated by reference here in their entirety. Testing systems that use boundary-scan technology in order to facilitate integrated circuit testing, board testing, and/or system level testing are also commercially-available from a variety of vendors including Agilent Technologies Inc.; Corelis, Inc.; ASSET InterTech, Inc.; JTAG Technologies B.V., Goepel Electronics; Teredyne Inc.; Agere Systems; Sightsys LTD.; Intellitech Corp.; Acugen Software; and others.

Examples of devices that implement the IEEE/ANSI 1149.1 standard in an IC include, but are not limited to, JTAG driving devices and JTAG receiving devices, wherein the devices are registers. The JTAG devices may be utilized for testing electrical characteristics and conductivity of the IC in which the JTAG devices are located.

Unfortunately, creating BSDL files is a tedious and error prone process since IC designers are required to map pin names of ICs to corresponding JTAG driving devices and receiving devices. Mapping of ICs is currently performed by observing netlists utilized for top-level design and by manually determining which top-level port of the IC is associated with which JTAG device.

SUMMARY OF THE INVENTION

In light of the foregoing, the preferred embodiment of the present invention generally relates to a system for generating a boundary-scan description language file for an integrated circuit.

Generally, with reference to the structure of the data generation system, the system utilizes a memory; software stored within the memory defining functions to be performed by the system; and a processor. The processor is configured by the software to perform the steps of: creating a flat netlist that describes the integrated circuit, wherein the flat netlist comprises connectivity information regarding leaf cells within the integrated circuit; determining and storing a name provided for each joint test action group register located within the integrated circuit, from the created flat netlist; determining relationships between each joint test action group register located within the integrated circuit and at least one input/output pin located within the integrated circuit, from the created flat netlist, and storing a description of the relationships; and creating a boundary-scan description language file from the stored names of each joint test action group and the stored description of the relationship between the joint test action group register and the input/output pin.

The present invention can also be viewed as providing a method for generating a boundary-scan description language file for an integrated circuit. In this regard, the method can be broadly summarized by the following steps: creating a flat netlist that describes the integrated circuit, wherein the flat netlist comprises connectivity information regarding leaf cells within the integrated circuit; determining and storing a name provided for each joint test action group register located within the integrated circuit, from the created flat netlist; determining relationships between each joint test action group register located within the integrated circuit and at least one input/output pin located within the integrated circuit, from the created flat netlist, and storing a description of the relationships; and creating a boundary-scan description language file from the stored names of each joint test action group and the stored description of the relationship between the joint test action group register and the input/output pin.

Other systems and methods of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components of the drawings are not necessarily to scale, emphasis instead being placed upon clearly illustrating the principles of the present invention. Moreover, in the drawings, like referenced numerals designate corresponding parts throughout the several views.

DETAILED DESCRIPTION OF THE PREFERRED EMBODIMENT

The data generating system of the present invention can be implemented in software, firmware, hardware, or a combination thereof. In the preferred embodiment of the invention, which is intended to be a non-limiting example, a portion of the system is implemented in software that is executed by a computer, for example, but not limited to, a server, a personal computer, work station, minicomputer, or main frame computer.

The software based portion of the data generating system, which comprises an ordered listing of executable instructions for implementing logical functions, can be embodied in any computer-readable medium for use by, or in connection with, an instruction execution system, apparatus, or device such as a computer-based system or processor containing system, or other system that can fetch the instructions from the instruction execution system, apparatus, or device and execute the instructions. In the context of this document, a "computer-readable medium" can be any means that can contain, store, communicate, propagate or transport the program for use by or in connection with the instruction execution system, apparatus or device.

The computer-readable medium can be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disk read-only memory (CD ROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner, if necessary, and then stored in a computer memory.

Figure 1:
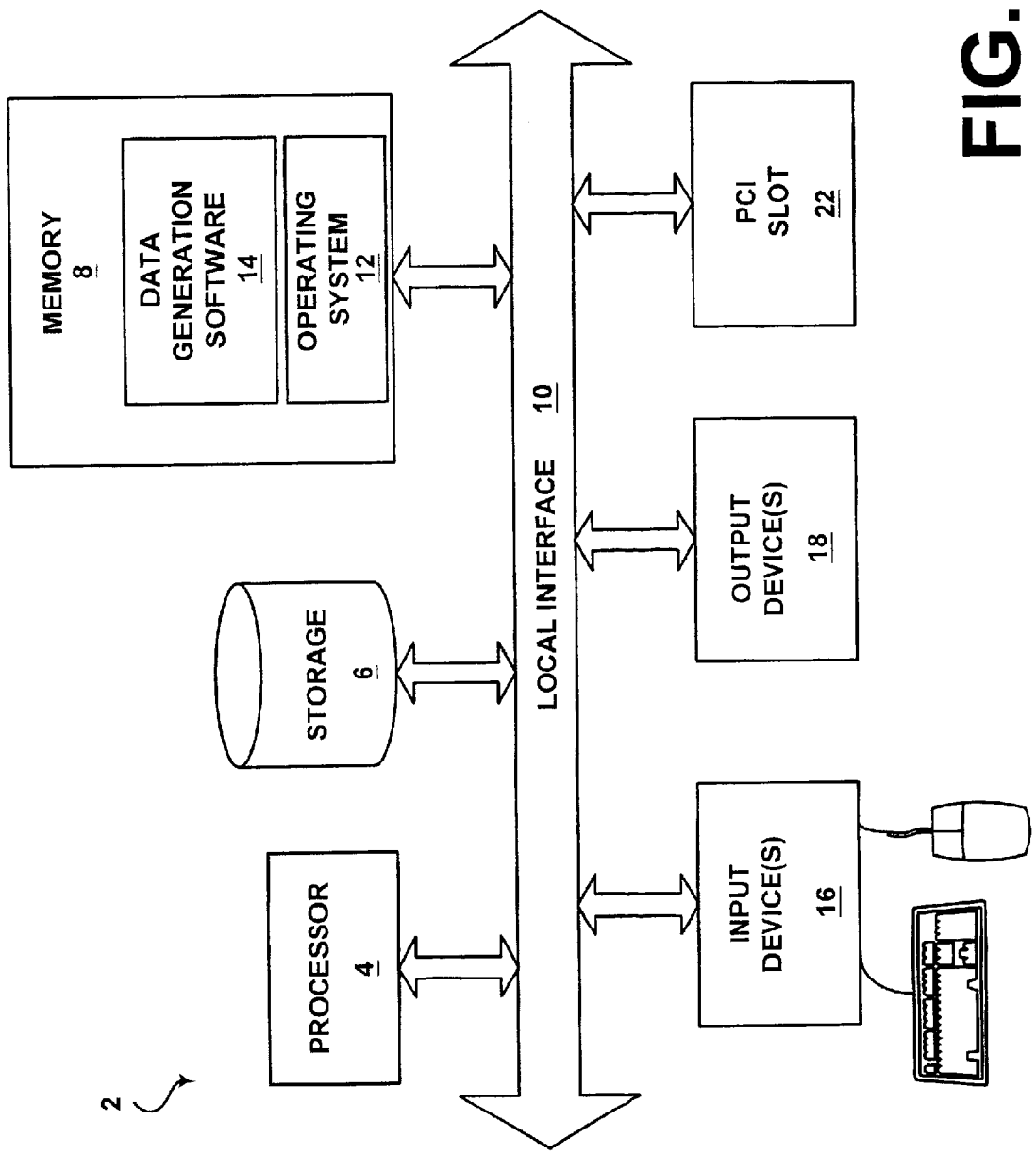
FIG. 1 is a typical computer or processor-based system that may be utilized to create a BSDL file for testing an integrated circuit.

Referring now to the drawings, wherein like reference numerals designate corresponding parts throughout the drawings, FIG. 1 is a typical computer or processor-based system 2 that may be utilized to create a BSDL file for testing an IC. The computer system 2 generally comprises a processor 4, a storage device 6, and a computer memory 8. The processor 4 accepts data from the computer memory 8 over a local interface 10, such as a bus(es), or a dedicated path. Specifically, with regard to the preferred embodiment of the invention, the local interface 10 is a PCI bus. The computer memory 8 has an operating system 12 defined therein and data generation software 14. The data generation software 14 is utilized to create the BSDL file, as is described in detail below. It should be noted that the data generation software may be PERL, C+, or any other ASCII producing software.

The computer system 2 also comprises input device(s) 16 and output device(s) 18. Generally, the computer system 2 may run any of a number of different platforms and operating systems, including, but not limited to, the Unix®, WindowsNT®, SunSolaris® or any such operating system. A PCI slot 22 may also be located within the computer system 2, which is attached to the local interface 10, for providing a means for a peripheral device, such as a network interface card (NIC), to attach to the computer system 2.

Figure 2:
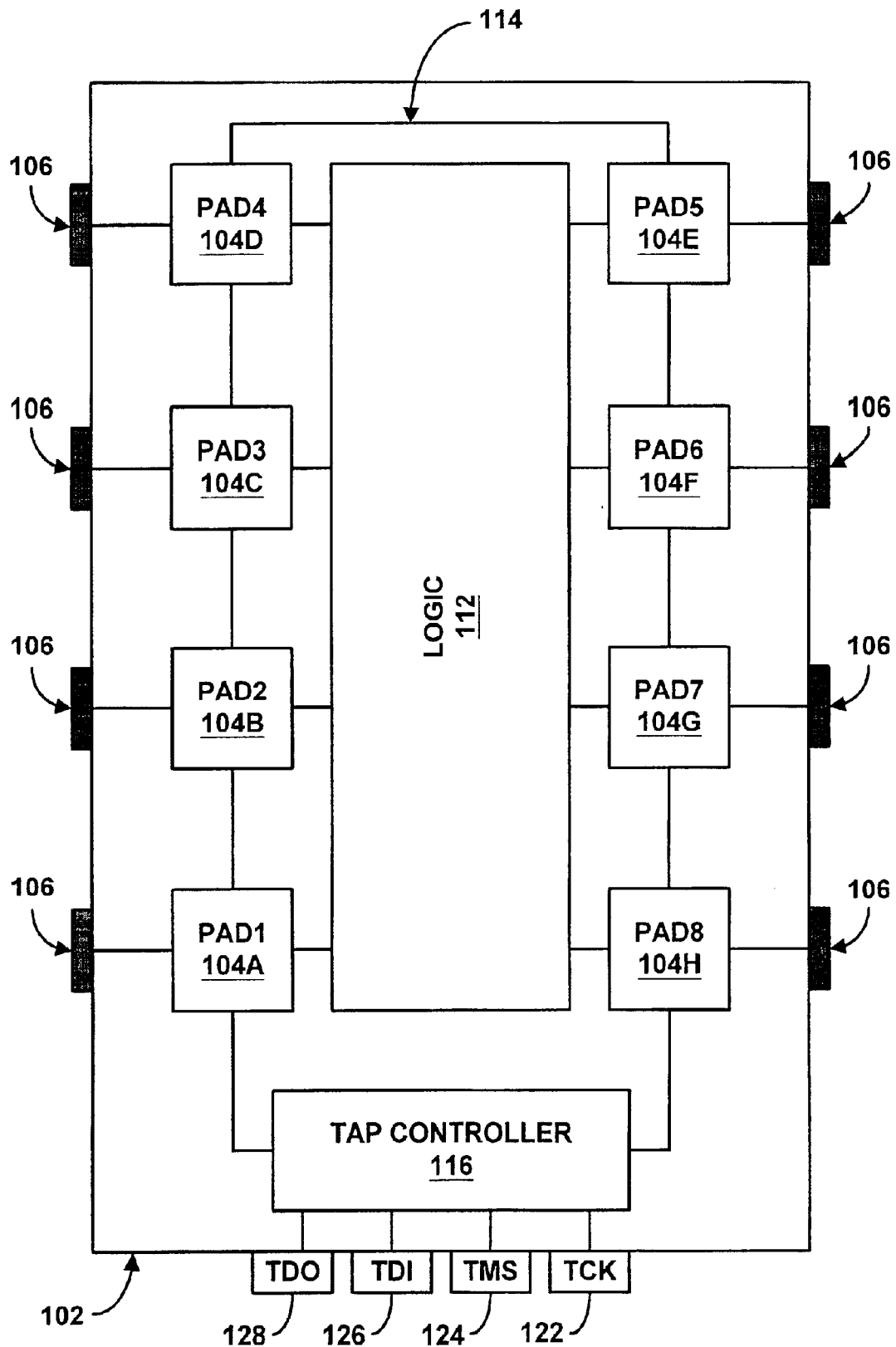
FIG. 2 is a block diagram of an IC that may be tested by the BSDL file.

FIG. 2 is a block diagram of an IC 102 that may be tested by the BSDL file after creation by the data generation software 14. It should be noted that the BSDL file allows the description of testability features of components within the IC 102 that comply with the IEEE standard 1149.1. As is explained below, the BSDL file can be used by tools that make use of the testability features of components within the IC 102. Such tools include testability analyzers, test generators, and/or fault diagnosis routines, such as, but not limited to, simulation program for integrated circuit emphasis (SPICE). With the BSDL file, which describes the IC 102, and with knowledge of the IEEE 1149.1 standard, software tools are capable of understanding data transport characteristics of the IC 102, specifically, how the IC 102 captures, shifts, and/or updates data.

As is shown by FIG. 2, the IC 102 comprises a series of pads, designated as pad1 104A, pad2 104B, pad3 104C, pad4 104D, pad5 104E, pad6 104F, pad7 104G, and pad8 104H. It should be noted that the number of pads (summarily denoted as 104) within the IC 102 may differ from the number of pads 104 shown by FIG. 2. A logic portion 112 is located within the IC 102, which comprises logic specific to the functionality of the IC 102. Therefore, the logic portion 112 may be structurally and functionally different for different ICs 102.

Each pad 104 is connected to an input/output (I/O) pin (summarily denoted as 106) that allows the IC 102 to connect to a printed circuit board (PCB) (not shown). Specifically, as shown by FIG. 2, pad1 104A is connected to a first I/O pin 106A; pad2 104B is connected to a second I/O pin 106B; pad3 104C is connected to a third I/O pin 106C; pad4 104D is connected to a fourth I/O pin 106D; pad5 104E is connected to a fifth I/O pin 106E; pad6 104F is connected to a sixth I/O pin 106F; pad7 104G is connected to a seventh 1/0 pin 106G; and, pad8 104H is connected to an eighth I/O pin 106H.

The pads 104 are serially connected to each other via a boundary register scan chain 114. As is known in the art, the boundary register scan chain 114 connects JTAG registers (shown by FIG. 3) in serial within each pad 104 to allow for testing of electrical properties and/or conductivity of the IC 102. An example of a testing procedure may include bypassing specific JTAG registers and loading data into a different JTAG register, wherein the data is later captured at a different location within the boundary-scan chain 114, thereby allowing for verification of electrical properties and/or conductivity of the IC 102.

A test access port (TAP) controller 116 is located within the IC 102 to facilitate IC 102 testing. The TAP controller 116, is described in detail by the IEEE 1149.1 standard, which is incorporated herein by reference in its entirety. Specifically, the TAP controller 116 is utilized by an IC tester or testing program, such as, but not limited to, SPICE, to execute a set of IC 102 testing vectors that have been previously generated by use of the generated BSDL file. As is known in the art, the IC 102 testing vectors are test stimuli used to test integrity of pads 104, connectivity within pads 104, and testability within the IC 102. The IC 102 testing process is further discussed below.

The TAP controller 116 is preferably a state machine that controls operations associated with JTAG registers so that relationships between JTAG registers and I/O pins 106 may be tested. Preferably, the TAP controller 116 is connected to the first pad 104 within the boundary register scan chain 114. In addition, the TAP controller 116 is connected to an output of the last pad 104, in accordance with FIG. 2, pad8 104H, located within the IC 102.

Basic operation of the TAP controller 116 is controlled through four pins that are located on the IC 102 and connected to the TAP controller 116 via interconnect. The four pins include, a test clock (TCK) pin 122, a test mode select (TMS) pin 124, a test data in (TDI) pin 126, and a test data out (TDO) pin 128. The TCK pin 122 and the TMS pin 124 direct signals between TAP controller 116 states. The TDI pin 126 and the TDO pin 128 receive data input and output signals for the boundary-scan chain 114. More specifically, the TDI pin 126 may be utilized to receive serial data from the tester or test program that is to be transmitted to the boundary-scan chain 114 for testing purposes. The TAP controller 116 receives the serial data from the TDI pin 126 via interconnect and is capable of transmitting the data to the boundary-scan chain 114. It should be noted that a fifth pin (TRST) may optionally be implemented as an asynchronous reset to the TAP controller 116. The TDO pin 128 may then be utilized by the tester or testing program to observe the serial data after being received by the TAP controller 116.

Figure 3:
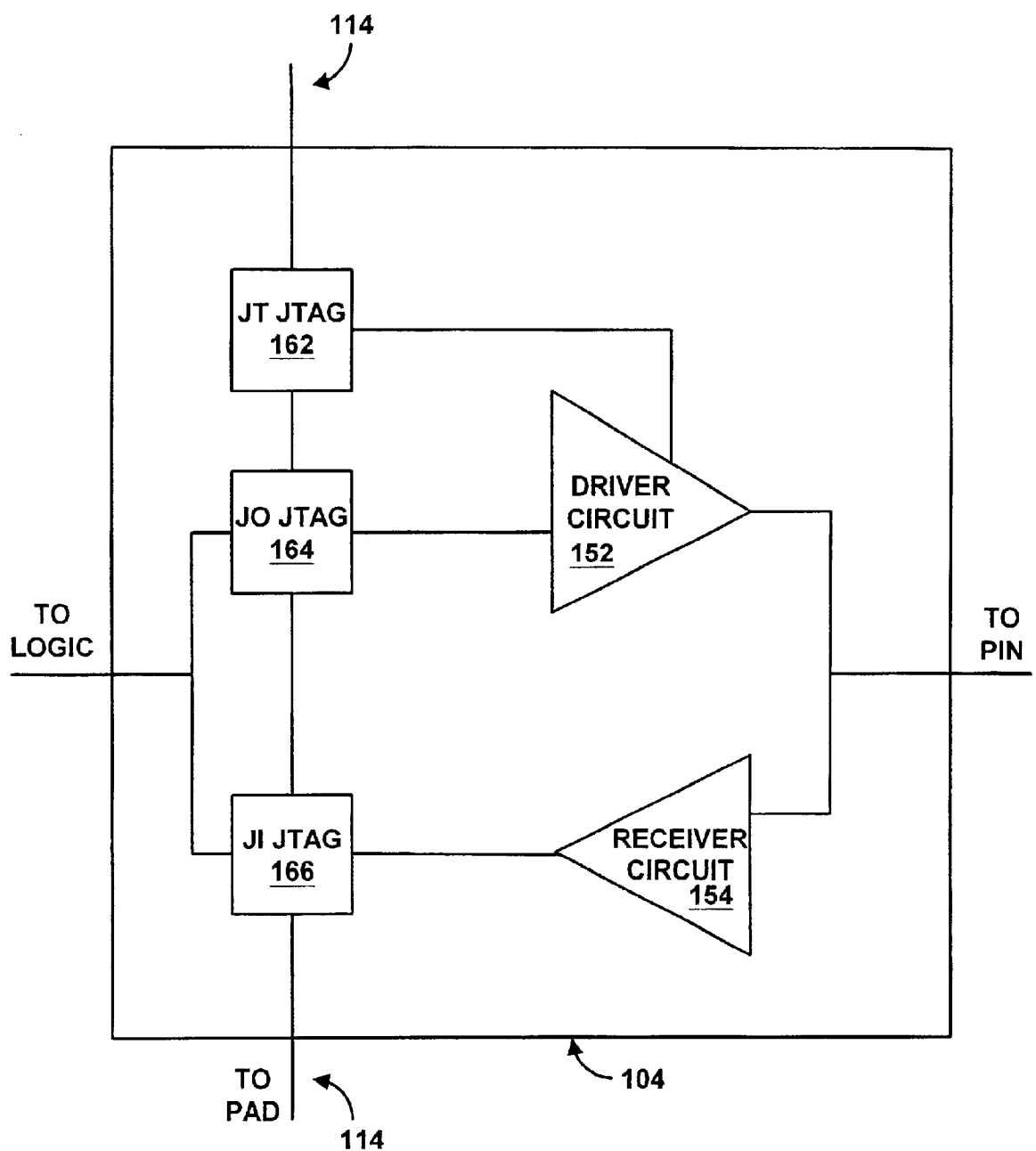
FIG. 3 is a block diagram further illustrating a pad shown by FIG. 2.

FIG. 3 is a block diagram further illustrating a pad 104 shown by FIG. 2. As shown by FIG. 3, a pad 104 comprises a driver circuit 152, a receiver circuit 154, a JT JTAG register 162, a JO JTAG register 164, and a JI JTAG register 166. Preferably, the JTAG registers 162, 164, 166 are master/slave flip-flops that may be controlled by the TAP controller 116 (FIG. 2). As has been mentioned above, the JTAG registers 162, 164, 166 are serially connected via the boundary-scan chain 114.

The JT JTAG register 162 may be utilized to tri-state the driver circuit 152. The JO JTAG register 164 may be utilized to drive serial data to the driver circuit 152 and/or communicate with the logic portion 112 (FIG. 2) of the IC 102. In addition, the JI JTAG register 166 receives an output of the receiver circuit 154 and/or communicates with the logic portion 112 of the IC 102. Preferably, the driver circuit 152 and the receiver circuit 154 are three-latch devices that may be shifted. The driver circuit 152 may be utilized to drive serial data received from the JO JTAG register 164, while the receiver circuit 154 may be utilized to transmit serial data to the JI JTAG register 166. The JT JTAG register 162 is connected to an input of the pad 104 and the JO JTAG register 164 via the boundary-scan chain 114. As stated above, the JT JTAG register 162 is also connected to the driver circuit 152 for tri-stating.

The JO JTAG register 164 is connected to the JT JTAG register 162 and the JI JTAG register 166 via the boundary-scan chain 114. In addition, JO JTAG register 164 is connected to an input of the driver circuit 152 for providing the driver circuit 152 with serial data utilized for testing the IC 102. The JI JTAG register 166 is connected to the JO JTAG register 164 and an output of the pad 104 via the boundary-scan chain 114. As mentioned above, the boundary-scan chain 114 is also connected to other pads 104. The JI JTAG register 166 is also connected to an output of the receiver circuit 154. An output of the driver circuit 152 and an input of the receiver circuit 154 are connected to each other, as well as being connected to an I/O pin 106 (FIG. 2).

Prior to placement of the IC 102 onto a PCB, electrical characteristics and/or connectivity of the IC 102 are tested. Testing of the IC 102 is performed via use of the BSDL file generated by the data generation software 14. As stated above, the tester, or testing program, uses the generated BSDL file to generate a set of vectors for testing integrity of pads 104 and testability within the IC 102. The BSDL file describes the internal structure of the IC 102 and relationships between JTAG registers 162, 164, 166 and I/O pins 106 within each pad 104, and between different pads 104A–104H within the IC 102. The TAP controller 116 may then be utilized by the tester, or testing program, to execute the testing vectors.

Traditionally, the BSDL file is created by manually determining and providing relationships within each pad 104. Relationships within each pad 104 may be determined by utilizing a netlist, such as a Verilog netlist, that represents conductivity within the pad 104. The netlist may be stored within the storage device 6 (FIG. 1) or elsewhere. As is known in the art, a netlist is a logical representation of internal connectivity of an IC. Relationships within each pad 104 include connections between JTAG registers 162, 164, 166, the driver circuit 152, the receiver circuit 154, and the I/O pin 106. To complicate matters, the BSDL file requires definition of relationships for all pads 104 located within the IC 102. Since there may be many pads 104 located on a single IC 102, different names are required for each different pad 104, including associated JTAG registers 162, 164, 166, driver circuit 152, receiver circuit 154, and I/O pin 106, when creating the BSDL file. Manually determining and providing the names and relationships of each different pad 104 and associated JTAG registers 162, 164, 166, driver circuit 152, receiver circuit 154, and I/O pin 106 for the BSDL file, is a tedious task.

Figure 4:
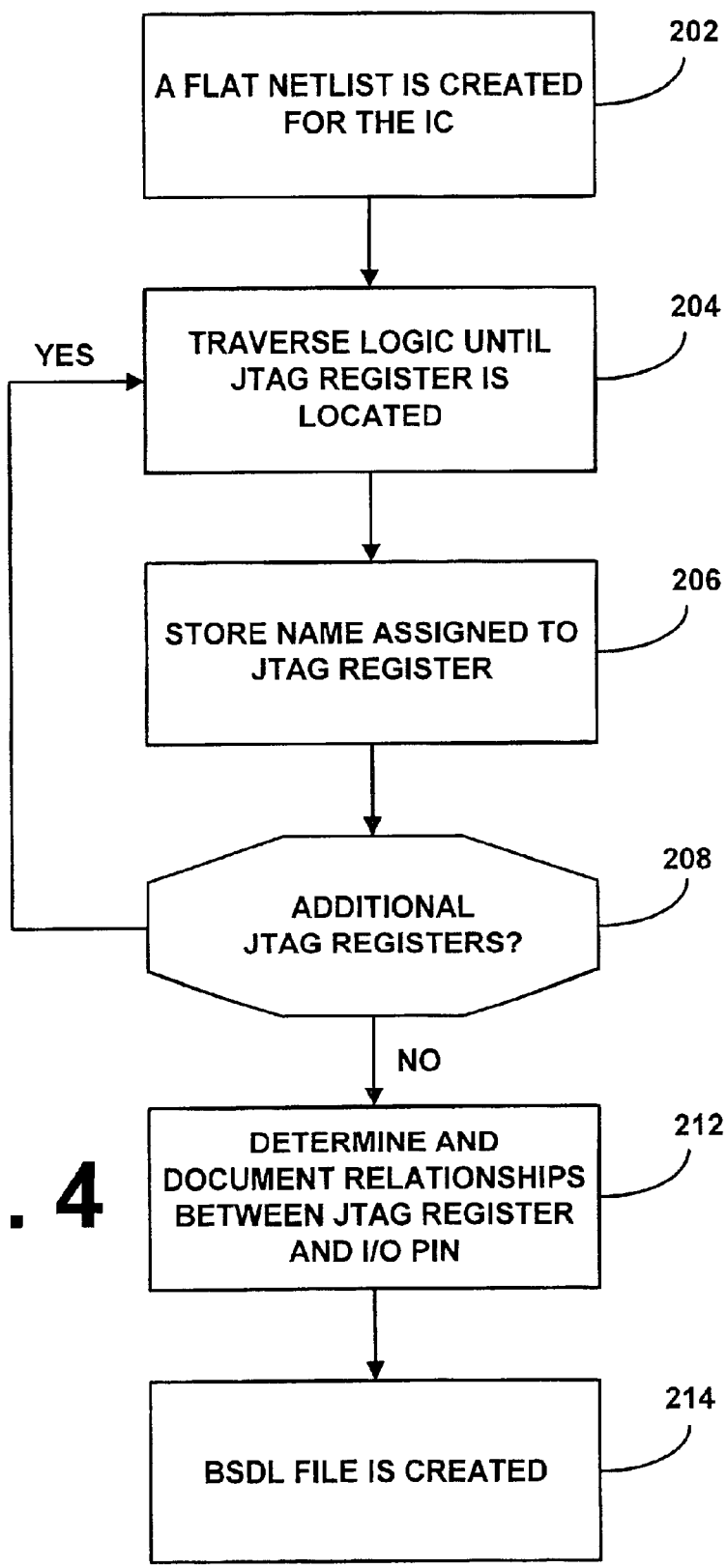
FIG. 4 is a flow chart that shows the architecture, functionality, and operation of a possible implementation of the present data generating system that automates the process of creating a BSDL file.

FIG. 4 is a flow chart that shows the architecture, functionality, and operation of a possible implementation of the present data generating system that automates the process of creating the BSDL file. In this regard, each block represents a module, segment, or portion of code, which comprises one or more executable instructions for implementing the specified logical function(s). It should also be noted that in some alternative implementations, the functions noted in the blocks may occur out of the order noted. For example, two blocks shown in succession may in fact be executed substantially concurrently or the blocks may sometimes be executed in the reverse order, depending upon the functionality involved, as will be further clarified herein below.

As shown by block 202, a flat netlist is created for the IC 102. The flat netlist is created by traversing hierarchical netlists that describe portions of the IC 102, for individual netlists focused upon the logic portion 112 of the IC 102 and the pads 104, and combining connectivity information provided by the individual netlists into a single file, referred to herein as the flat netlist. The resulting flat netlist provides connectivity information, or data structures, that represent wires within the IC 102, leaf cells within the IC 102, and I/O pins 114. As is known by those of ordinary skill in the art, leaf cells comprise registers and/or combinational cells such as an AND gate or an OR gate.

As shown by block 204, a script defined by the data generation software 14 (FIG. 1) is utilized to traverse the flat netlist, which defines data structures of the IC 102, until a JTAG register 162, 164, 166 is located. Since the flat netlist represents data structures, the following describes traversal of the flat netlist as traversal of structures located within the IC 102.

Traversal of the flat netlist begins from an input to the first pad 104A, which is also the beginning of the boundary-scan line 114, and which is connected to an output of the TAP controller 116. Multiple logical devices may be connected to the boundary-scan line 114 including, but not limited to, buffers utilized to drive signals along the boundary-scan line 114 and leaf cells. As noted above, the traversal step preferably utilizes the previously created flat netlist (block 202) since connections between leaf cells have been previously defined.

As shown by block 206, when a JTAG register 162, 164, 166 has been located (block 204), the name assigned to the located JTAG register 162, 164, 166 is stored within a JTAG register name list located within the storage device 6 (FIG. 1). A determination is then made as to whether additional JTAG registers 162, 164, 166 are located within the IC 102 by progressing along the path of the boundary-scan line 114 (block 208). Determination of additional JTAG registers 162, 164, 166 is performed by traversing the boundary-scan line 114 from an output of the previously located JTAG register 162, 164, 166 until another leaf cell is found. If the next located leaf cell is not a JTAG register 162, 164, 166, wires connected to the next located leaf cell are then examined to determine if a JTAG register 162, 164, 166 is connected to the wires.

If another JTAG register 162, 164, 166 is located, the name assigned to the located JTAG register 162, 164, 166 is stored. The steps described by block 204 and block 206 are repeated until traversal of the IC 102 ends at the TAP controller 116. It should be noted that the JTAG register names are stored within the storage device 6 in the same order that they were discovered during traversal. It should also be noted that completion of the traversing process, ending at the TAP controller 116, provides evidence that the JTAG registers 162, 164, 166 located within the IC 102 are properly connected.

As shown by block 212, relationships between each JTAG register 162, 164, 166 and an I/O pin 106 are determined and stored within the memory 8 (FIG. 1) for use in creating the BSDL file. It should be noted that the storage device 6 may be utilized for storing relationships between each JTAG register 162, 164, 166 and an I/O pin 106, as opposed to the memory 8. Determination of JTAG register 162, 164, 166 and I/O pin 106 relationships is performed by the script sequentially searching the flat netlist for each JTAG register 162, 164, 166 listed within the JTAG register name list. For each JO JTAG register 164, the flat netlist is traversed, starting from the wire connected from an output of the JO JTAG register 164 to the input of the driver circuit 152. Logic is continually traversed until an I/O pin 106 is located. The path from the output of the JO JTAG register 164 to the I/O pin 106 is stored for use in creating the BSDL file.

Since description of the JO JTAG 164 requires a description of the driver circuit 152, which is tri-stated by the JT JTAG register 162, a description of the JT JTAG register 162 is also required. Therefore, the flat nedist is traversed from an output of the JT JTAG register 162 to the driver circuit 152 and continued until an I/O pin 106 is located. The path from the output of the JT JTAG register 162 to the I/O pin 106 is stored for use in creating the BSDL file.

With reference to the JI JTAG register 166, the flat netlist is traversed from an output of the JI JTAG register 162 to the output of the receiver circuit 154 and continued until an I/O pin 106 is located. The path from the output of the JI JTAG register 166 to the I/O pin 106 is stored for use in creating the BSDL file.

After storage of the JTAG register names in the same order that they were discovered during traversal and storage of relationships between each JTAG register 162, 164, 166 and an I/O pin 106, the script automatically creates the BSDL (block 214). The script automatically creates the BSDL file, or description of the IC 102, by redefining the above mentioned stored names and relationships, using BSDL lexicography and syntax, into a format compatible with BSDL files. One of ordinary skill in the art would know how to redefine the stored names and relationships into a format compatible with BSDL files.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method of generating a boundary-scan description language file for an integrated circuit, comprising the steps of:

creating a flat netlist that describes said integrated circuit, wherein said flat netlist comprises connectivity information regarding leaf cells within said integrated circuit;

determining and storing a name for each joint test action group register located within said integrated circuit, from said created flat netlist;

determining relationships between each joint test action group register located within said integrated circuit and at least one input/output pin located within said integrated circuit, from said created flat netlist, and storing a description of said relationships; and creating said boundary-scan description language file from said stored names of each joint test action group register and said stored description of said relationships between said each joint test action group register and said at least one input/output pin.

2. The method of claim 1, wherein said step of creating a flat netlist further comprises the steps of:

traversing at least one hierarchical netlist that describes portions of said integrated circuit, for at least one individual netlist that describes a logic portion of said integrated circuit; and combining connectivity information provided by said at least one individual netlist, resulting in said flat netlist.

3. The method of claim 2, wherein said connectivity information comprises relationships between wires within said integrated circuit, said leaf cells located within said integrated circuit and input/output pins.

4. The method of claim 2, wherein said joint test action group register names are stored in the same order discovered during said traversing step.

5. The method of claim 2, further comprising the step of:

traversing said at least one hierarchical netlist for at least one individual netlist that describes at least one pad located within said integrated circuit.

6. The method of claim 5, wherein said step of traversing said at least one hierarchical netlist is started at a beginning of a boundary-scan line, and wherein said step of traversing is ended at an end of said boundary-scan line.

7. The method of claim 1, wherein said joint test action group registers comprise a JO joint test action group register, a JT joint test action group register, and a JI joint test action group register.

8. A system for generating a boundary-scan description language file for an integrated circuit, comprising:

means for creating a flat netlist that describes said integrated circuit, wherein said flat netlist comprises connectivity information regarding leaf cells within said integrated circuit;

means for determining and storing a name for each joint test action group register located within said integrated circuit, from said created flat netlist;

means for determining relationships between each joint test action group register located within said integrated circuit and at least one input/output pin located within said integrated circuit, from said created flat netlist, and for storing a description of said relationships; and means for creating said boundary-scan description language file from said stored names of each joint test action group register and said stored description of said relationships between said each joint test action group register and said at least one input/output pin.

9. The system of claim 8, further comprising:

means for traversing at least one hierarchical netlist that describes portions of said integrated circuit, for at least one individual netlist that describes a logic portion of said integrated circuit; and means for combining connectivity information provided by said at least one individual netlist, resulting in said flat netlist.

10. The system of claim 9, wherein said connectivity information comprises relationships between wires within said integrated circuit, said leaf cells located within said integrated circuit and input/output pins.

11. The system of claim 9, wherein said joint test action group register names are stored in the same order discovered during traversing.

12. The system of claim 9, further comprising means for traversing said at least one hierarchical netlist for at least one individual netlist that describes at least one pad located within said integrated circuit.

13. The system of claim 12, wherein said means for traversing said at least one hierarchical netlist begins traversing at a beginning of a boundary-scan line and ends traversing at an end of said boundary-scan line.

14. The system of claim 8, wherein said joint test action group registers comprise a JO joint test action group register, a JT joint test action group register, and a JI joint test action group register.

15. A system for generating a boundary-scan description language file for an integrated circuit, comprising:

a memory;

software stored within said memory defining functions to be performed by said system; and a processor configured by said software to perform the steps of:

creating a flat netlist that describes said integrated circuit, wherein said flat netlist comprises connectivity information regarding leaf cells within said integrated circuit;

determining and storing a name for each joint test action group register located within said integrated circuit, from said created flat netlist;

determining relationships between each joint test action group register located within said integrated circuit and at least one input/output pin located within said integrated circuit, from said created flat netlist, and storing a description of said relationships; and creating said boundary-scan description language file from said stored names of each joint test action group register and said stored description of said relationship between said each joint test action group register and said at least one input/output pin.

16. The system of claim 15, wherein said step of creating a flat netlist further comprises the steps of said processor traversing at least one hierarchical netlist that describes portions of said integrated circuit, for at least one individual netlist that describes a logic portion of said integrated circuit, and said processor combining connectivity information provided by said at least one individual netlist, resulting in said flat netlist.

17. The system of claim 16, wherein said connectivity information comprises relationships between wires within said integrated circuit, said leaf cells located within said integrated circuit and input/output pins.

18. The system of claim 16, wherein said joint test action group register names are stored in the same order discovered during said traversing step.

19. The system of claim 16, wherein said processor is further configured by said memory to perform the step of traversing said at least one hierarchical netlist for at least one individual netlist that describes at least one pad located within said integrated circuit.

20. The system of claim 19, wherein said step of traversing said at least one hierarchical netlist is started at a beginning of a boundary-scan line, and wherein said step of traversing is ended at an end of said boundary-scan line.

* * * * *